United States Patent
Chiu et al.

(10) Patent No.: US 12,382,709 B2
(45) Date of Patent: *Aug. 5, 2025

(54) SEMICONDUCTOR DEVICE STRUCTURE AND METHOD FOR FORMING THE SAME

(71) Applicant: TAIWAN SEMICONDUCTOR MANUFACTURING COMPANY, LTD., Hsinchu (TW)

(72) Inventors: Shih-Chuan Chiu, Hsinchu (TW); Jia-Chuan You, Taoyuan (TW); Chia-Hao Chang, Hsinchu (TW); Chun-Yuan Chen, HsinChu (TW); Tien-Lu Lin, Hsinchu (TW); Yu-Ming Lin, Hsinchu (TW); Chih-Hao Wang, Baoshan Township, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/405,040

(22) Filed: Jan. 5, 2024

(65) Prior Publication Data

US 2024/0162094 A1    May 16, 2024

Related U.S. Application Data

(60) Continuation of application No. 17/750,895, filed on May 23, 2022, now Pat. No. 11,901,238, which is a
(Continued)

(51) Int. Cl.
*H01L 23/522*    (2006.01)
*H01L 21/768*    (2006.01)
(Continued)

(52) U.S. Cl.
CPC ..... *H10D 84/038* (2025.01); *H01L 21/76829* (2013.01); *H01L 21/76897* (2013.01);
(Continued)

(58) Field of Classification Search
CPC ....... H01L 21/76829; H01L 21/823475; H01L 21/823431; H01L 21/823481;
(Continued)

(56) References Cited

U.S. PATENT DOCUMENTS 6,391,777 B1   5/2002   Chen et al.
6,838,379 B1   1/2005   Kwak et al.
(Continued)

*Primary Examiner* — Walter H Swanson
(74) *Attorney, Agent, or Firm* — Birch, Stewart, Kolasch & Birch, LLP

(57) ABSTRACT

A semiconductor device structure is provided. The semiconductor device structure includes a substrate, a conductive feature on the substrate, and an electrical connection structure on the conductive feature. The electrical connection includes a first grain made of a first metal material, and a first inhibition layer made of a second metal layer that is different than the first metal material. The first inhibition layer extends vertically along a first side of a grain boundary of the first grain and laterally along a bottom of the grain boundary of the first grain.

20 Claims, 15 Drawing Sheets

Related U.S. Application Data division of application No. 16/440,210, filed on Jun. 13, 2019, now Pat. No. 11,342,229.

(51) Int. Cl.
*H01L 27/088* (2006.01)
*H01L 29/06* (2006.01)
*H10D 30/01* (2025.01)
*H10D 30/62* (2025.01)
*H10D 62/10* (2025.01)
*H10D 84/01* (2025.01)
*H10D 84/03* (2025.01)
*H10D 84/83* (2025.01)

(52) U.S. Cl.
CPC ....... *H01L 23/5226* (2013.01); *H10D 30/024* (2025.01); *H10D 30/62* (2025.01); *H10D 62/115* (2025.01); *H10D 84/0149* (2025.01); *H10D 84/0151* (2025.01); *H10D 84/0158* (2025.01); *H10D 84/834* (2025.01)

(58) Field of Classification Search
CPC ......... H01L 29/66795; H01L 21/76877; H01L 21/76897; H01L 23/5226; H01L 29/0649; H01L 21/76867; H01L 21/76883; H01L 21/76886
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2002/0105082 A1 | 8/2002 | Andricacos et al. |
| 2003/0217462 A1 | 11/2003 | Wang et al. |
| 2005/0227479 A1 | 10/2005 | Feng et al. |
| 2007/0238294 A1 | 10/2007 | Beyer et al. |
| 2010/0126872 A1 | 5/2010 | Paneccasio, Jr. et al. |
| 2012/0273899 A1 | 11/2012 | Wann et al. |
| 2017/0271242 A1 | 9/2017 | Lo et al. |
| 2019/0393085 A1* | 12/2019 | Bhosale ............ H01L 21/76883 |

* cited by examiner

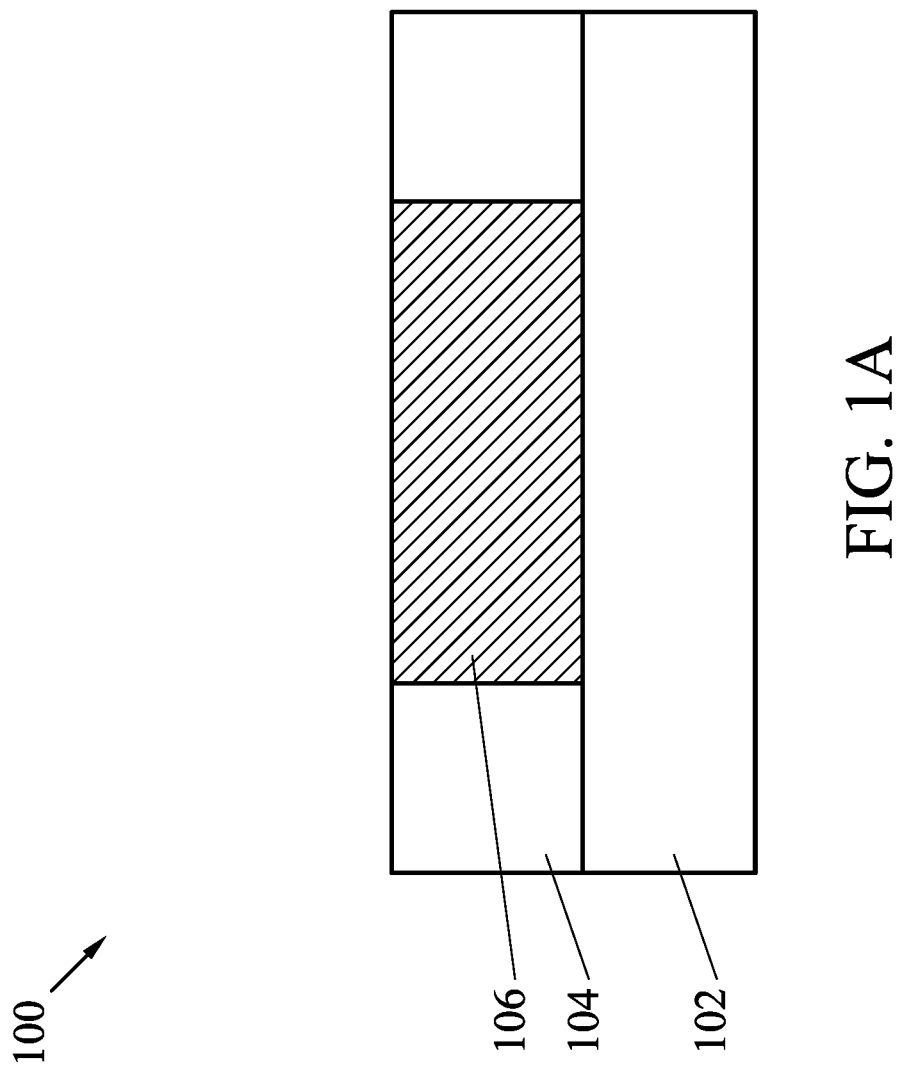

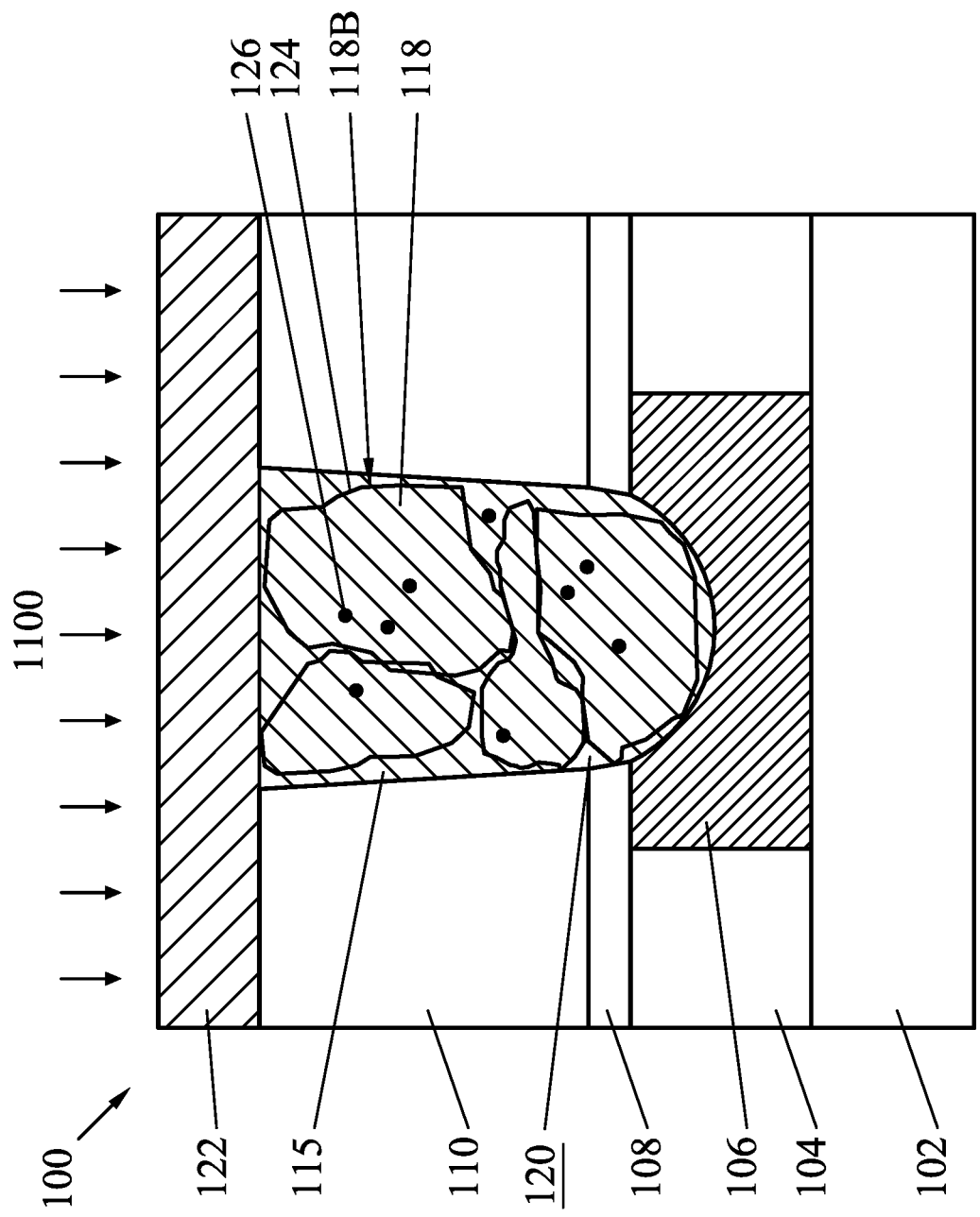

SEMICONDUCTOR DEVICE STRUCTURE AND METHOD FOR FORMING THE SAME

PRIORITY CLAIM AND CROSS-REFERENCE

This application is a continuation application of U.S. application Ser. No. 17/750,895, filed on May 23, 2022, entitled of "SEMICONDUCTOR DEVICE STRUCTURE," which is a divisional application of U.S. patent application Ser. No. 16/440,210, filed on Jun. 13, 2019 (now U.S. Pat. No. 11,342,229), entitled of "METHOD FOR FORMING A SEMICONDUCTOR DEVICE STRUCTURE HAVING AN ELECTRICAL CONNECTION STRUCTURE," which is incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-1I are cross-sectional views illustrating the formation of an electrical connection structure at various intermediate stages, in accordance with some embodiments of the disclosure.

FIGS. 1E-1, 1H-1 and 1I-1 are cross-sectional views illustrating the formation of an electrical connection structure having an air void at various intermediate stages, in accordance with some embodiments of the disclosure.

DETAILED DESCRIPTION

Figure 1B:
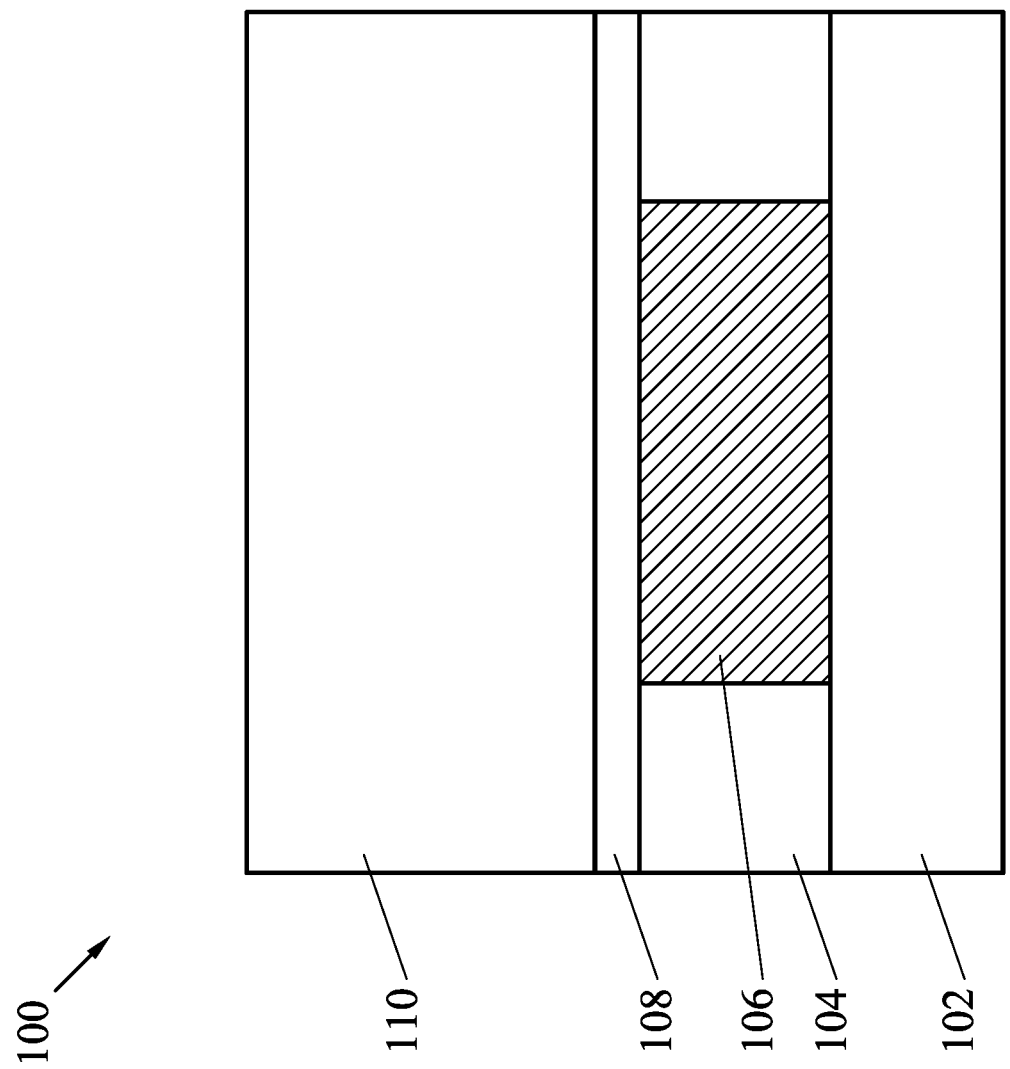

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more lithography processes, including double-patterning or multi-patterning processes. Generally, double-patterning or multi-patterning processes combine lithography and self-aligned processes, allowing patterns to be created that have, for example, pitches smaller than what is otherwise obtainable using a single, direct lithography process. For example, in one embodiment, a sacrificial layer is formed over a substrate and patterned using a lithography process. Spacers are formed alongside the patterned sacrificial layer using a self-aligned process. The sacrificial layer is then removed, and the remaining spacers may then be used to pattern the fins.

Embodiments of a method for forming an electrical connection structure (such as contact plugs, vias, and conductive lines) are provided. The method for forming the electrical connection structure may include forming a first metal material in an opening of a dielectric layer, forming a second metal material over the first metal material, and annealing the second metal material. The second metal material may form an inhibition layer in the first metal material to inhibit the first metal material from growing. Therefore, the likelihood of the formation of air voids on the sidewall of the electrical connection structure and the dimension of air voids may be reduced during the manufacture of the semiconductor device, which may enhance the reliability of the semiconductor device having the electrical connection structure.

FIGS. 1A-1I are cross-sectional views illustrating the formation of an electrical connection structure 128 at various intermediate stages, in accordance with some embodiments of the disclosure. FIGS. 1E-1, 1H-1 and 1I-1 are cross-sectional views illustrating the formation of an electrical connection structure 128 having an air void 120 at various intermediate stages, in accordance with some embodiments of the disclosure.

A semiconductor structure 100 is provided, as shown in FIG. 1A, in accordance with some embodiments. The semiconductor structure 100 includes a substrate 102, a layer 104, and a conductive feature 106, in accordance with some embodiments. The layer 104 is formed over the substrate 102, in accordance with some embodiments. The conductive feature 106 is formed through and/or in the layer 104, in accordance with some embodiments.

In some embodiments, the substrate 102 is a semiconductor substrate such as a silicon substrate. In some embodiments, the substrate 102 includes an elementary semiconductor such as germanium; a compound semiconductor such as gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor such as SiGe, GaAsP, AlInAs, AlGaAs, GaInAs, GaInP, and/or GaInAsP; or a combination thereof.

Various devices may be on the substrate 102. The substrate 102 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the substrate 102, in a portion of the substrate 102 and a portion of one or more overlying layers, and/or wholly in one or more overlying layers, for example. Further, processing described below may be implemented in Front End Of the Line (FEOL), Middle End Of the Line (MEOL), and/or Back End Of the Line (BEOL).

In some embodiments, the layer 104 is a portion of the substrate 102, and the conductive feature 106 is a conductive region of a transistor (e.g., planar FET) in the substrate 102, such as a p-type or n-type doped region. In some embodiments, the conductive feature 106 is formed by implanting a dopant into the layer 104.

In some embodiments, the layer 104 is respective portions of a first (lower) interlayer dielectric (ILD) layer, a contact etching stop layer (CESL), and gate spacers over the substrate 102, and the conductive feature 106 is a source/drain feature or a gate stack of a transistor (e.g., FinFET) over the substrate 102; or a contact or a plug to a source/drain feature or to a gate stack.

In some embodiments, the layer 104 is an inter-metal dielectric (IMD) layer over the substrate 102, and the conductive feature 106 is a metallization pattern, e.g., a metal line and/or a via.

In some embodiments, the layer 104 is formed of a dielectric material, such as silicon oxide ($SiO_2$), silicon nitride (SiN), silicon oxynitride (SiON), silicon carbon nitride (SiCN), oxygen-doped silicon carbide (SiC:O), oxygen-doped silicon carbon nitride (SiCN:O), silicon oxycarbide (SiOC), aluminum nitride (AlN), aluminum oxide ($Al_2O_3$), tetraethylorthosilicate (TEOS) oxide, un-doped silicate glass (USG), borophosphosilicate glass (BPSG), fluoride-doped silicate glass (FSG), phosphosilicate glass (PSG), borosilicate glass (BSG), organosilicate glasses (OSG), Spin-On-Glass, Spin-On-Polymers, silicon carbon material, or another suitable dielectric material.

In some embodiments, the dielectric material for layer 104 is formed using chemical vapor deposition (CVD) (such as low pressure CVD (LPCVD), plasma enhanced CVD (PECVD), high density plasma CVD (HDP-CVD), high aspect ratio process (HARP), and flowable CVD (FCVD)), atomic layer deposition (ALD), spin-on coating, another suitable method, or a combination thereof.

In some embodiments, the conductive feature 106 is formed of a metal material, such as cobalt (Co), tungsten (W), ruthenium (Ru), or a compound or an alloy based on Co, W, or Ru (i.e. main component is Co, W, or Ru). The compound or alloy of the conductive feature 106 may be formed by adding other elements, such as Ag, Cu, Au, Al, Ca, Be, Mg, Rh, Na, Ir, W, Mo, Zn, Ni, K, Co, Cd, Ru, In, Os, Si, and/or Ge, into the based metal (Co, W, or Ru).

An etching stop layer (ESL) 108 is formed over the layer 104 and the conductive feature 106, as shown in FIG. 1B, in accordance with some embodiments. Generally, an ESL may provide a mechanism to stop or slow down an etching process when forming, e.g., openings, holes, trenches, etc. The ESL may be formed of a dielectric material having a different etching selectivity from adjacent layers or components.

In some embodiments, the ESL 108 is formed of a dielectric layer, such as silicon oxide ($SiO_2$), silicon nitride (SiN), silicon oxynitride (SiON), silicon carbon nitride (SiCN), oxygen-doped silicon carbide (SiC:O), oxygen-doped silicon carbon nitride (SiCN:O), silicon oxycarbide (SiOC), aluminum nitride (AlN), aluminum oxide ($Al_2O_3$), or a combination thereof. In some embodiments, the ESL 108 is formed using CVD (such as LPCVD, PECVD, HDP-CVD, HARP, and FCVD), ALD, another suitable method, or a combination thereof.

The dielectric layer 110 is formed over the ESL 108, as shown in FIG. 1B, in accordance with some embodiments. In some embodiments, the dielectric layer 110 is formed of a dielectric layer, such as silicon oxide ($SiO_2$), silicon nitride (SiN), silicon oxynitride (SiON), silicon carbon nitride (SiCN), oxygen-doped silicon carbide (SiC:O), oxygen-doped silicon carbon nitride (SiCN:O), silicon oxycarbide (SiOC), aluminum nitride (AlN), aluminum oxide ($Al_2O_3$), TEOS oxide, USG, BPSG, FSG, PSG, BSG, OSG, Spin-On-Glass, Spin-On-Polymers, silicon carbon material, or another suitable dielectric material. In some embodiments, the dielectric layer 110 is formed using CVD (such as LPCVD, PECVD, HDP-CVD, HARP, and FCVD), ALD, spin-on coating, another suitable method, or a combination thereof.

Figure 1C:
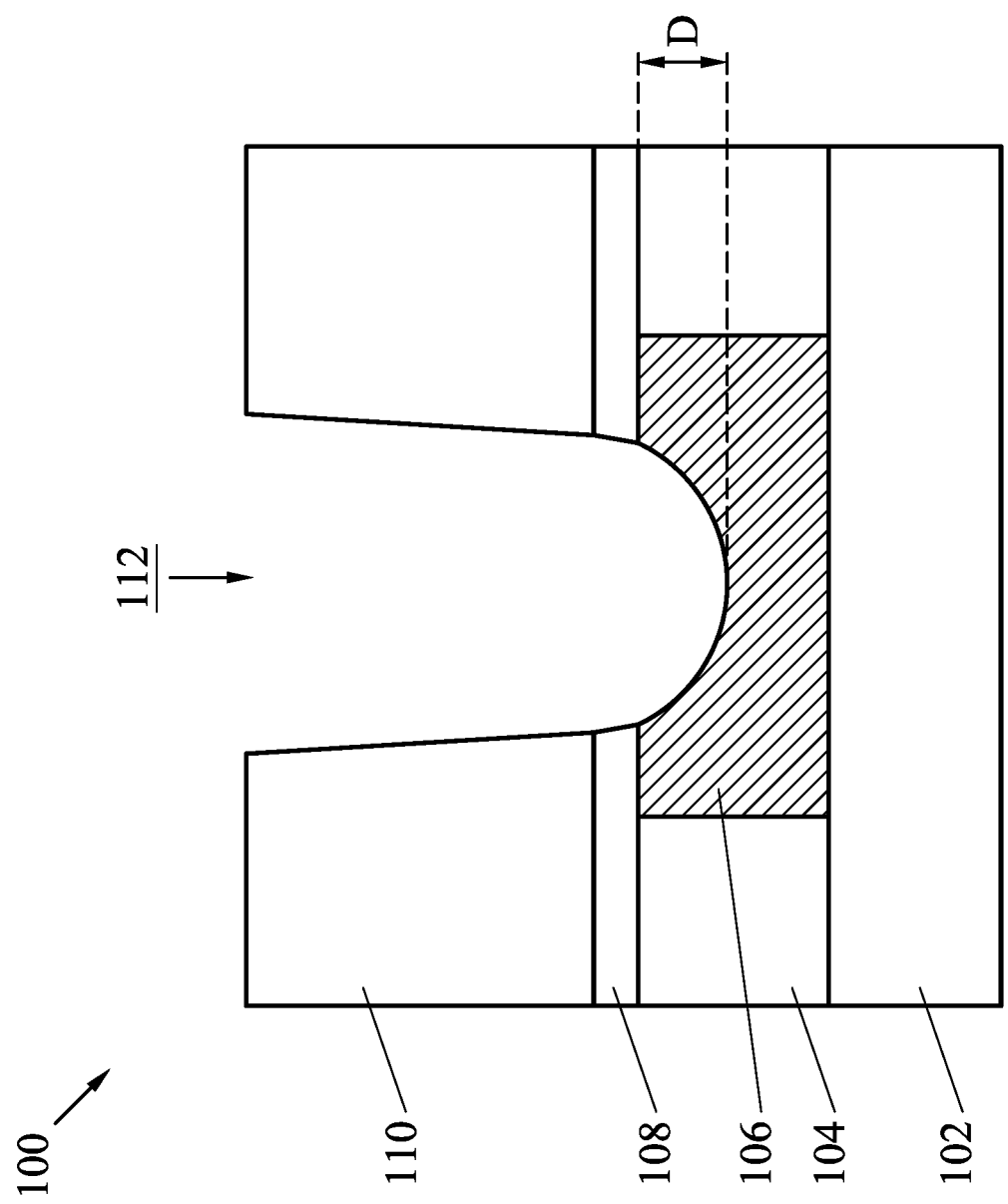

The semiconductor structure 100 is patterned to form an opening 112, as shown in FIG. 1C, in accordance with some embodiments. The opening 112 may be a hole and/or a trench where a conductive feature will be filled in. The opening 112 passes through the dielectric layer 110 and the ESL 108 to expose the upper surface of the conductive feature 106, in accordance with some embodiments. The opening 112 extends into the conductive feature 106, in accordance with some embodiments. In some embodiments, the aspect ratio of the opening 112 is in a range from about 3 to about 5.

In some embodiments, the steps of forming the opening 112 includes forming a patterned mask layer (not shown) on the dielectric layer 110, and etching the dielectric layer 110 and the ESL 108 uncovered by the patterned mask layer.

For example, a photoresist may be formed on the dielectric layer 110, such as by using spin-on coating, and patterned with a pattern corresponding to the opening 112 by exposing the photoresist to light using an appropriate photomask. Exposed or unexposed portions of the photo resist may be removed depending on whether a positive or negative resist is used. The pattern of the photoresist may then be transferred to the dielectric layer 110 and the ESL 108, such as by using one or more suitable etch processes. The photoresist can be removed in an ashing or wet strip process, for example.

For example, a hard mask layer may be formed on the dielectric layer 110. The hard mask layer may include, or be formed of, a nitrogen-free anti-reflection layer (NFARL), carbon-doped silicon dioxide (e.g., SiO2:C), titanium nitride (TiN), titanium oxide (TiO), boron nitride (BN), a multilayer thereof, or another suitable material. The hard mask layer may be patterned using photolithography and etching processes described above to have a pattern corresponding to the opening 112. The hard mask layer may transfer the pattern to the dielectric layer 110 and the ESL 108 to form the opening 112 which may be by using one or more suitable etch processes.

The etch processes may include a reactive ion etch (RIE), neutral beam etch (NBE), inductive coupled plasma (ICP) etch, the like, or a combination thereof. The etch processes may be anisotropic. The etch processes may include an over-etching step to extend the opening 112 into the conductive feature 106 to a depth D.

A barrier layer (not shown) may optionally be formed along the sidewall and the bottom surface of the opening 112. The barrier layer is used to prevent the metal from the subsequently formed metal material from diffusing into the dielectric material (e.g. the dielectric layer 110 and ESL 108). For example, if the subsequently formed metal material does not easily diffuse into the dielectric material, the barrier layer may be omitted. The barrier layers may be formed of tantalum (Ta), tantalum nitride (TaN), titanium (Ti), titanium nitride (TiN), cobalt tungsten (CoW), or another suitable material.

A glue layer (not shown) may optionally be formed along the sidewall and the bottom surface of the opening 112, and on the barrier layer (if formed). The glue layer is used to improve adhesion between the subsequently formed metal material and the dielectric material (e.g. the dielectric layer 110 and ESL 108). The glue layer may be formed of tantalum nitride (TaN), titanium (Ti), titanium nitride (TiN), or another suitable material.

Figure 1D:
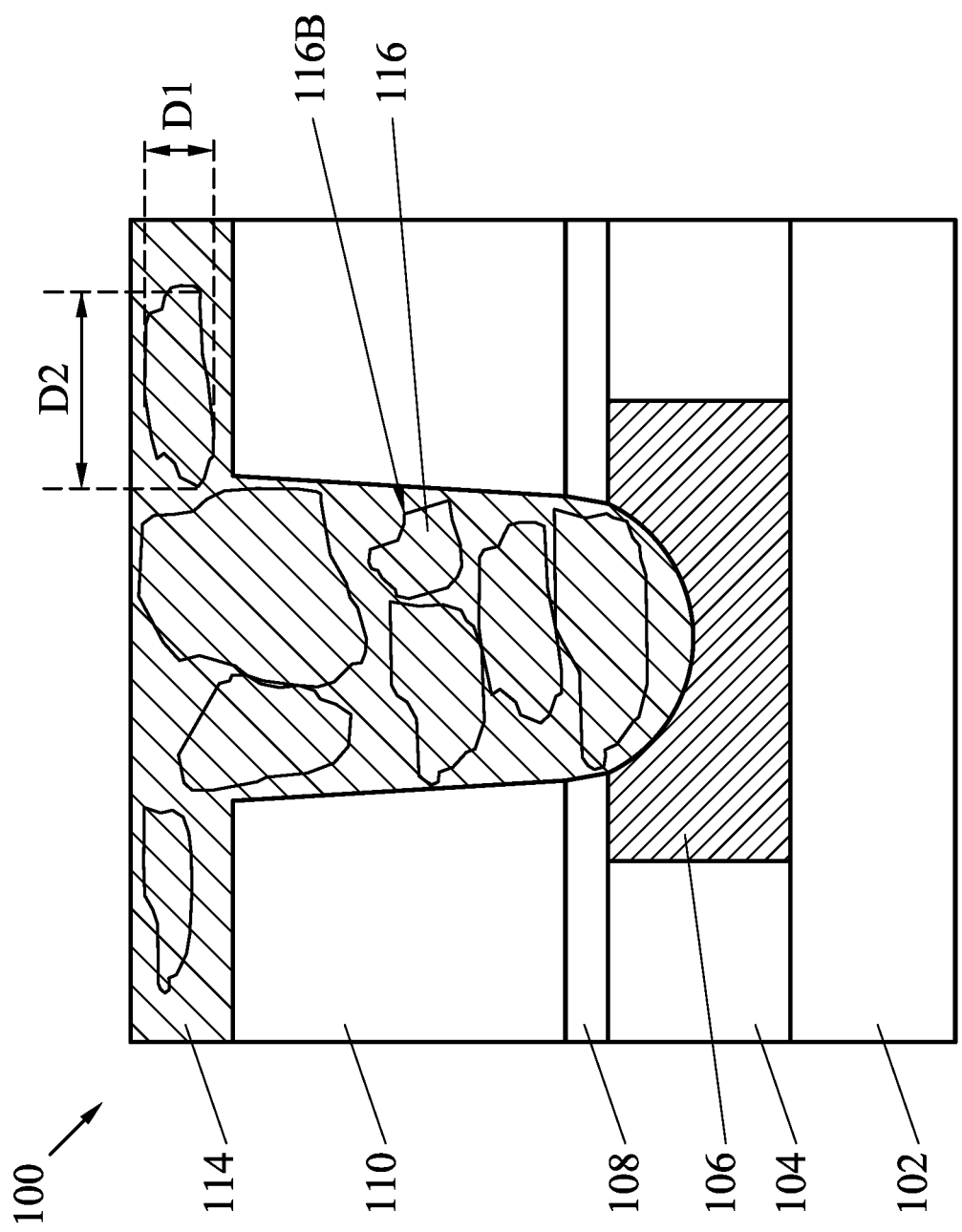

A metal material 114 is formed over the semiconductor structure 100, as shown in FIG. 1D, in accordance with some embodiments. The metal material 114 is formed over the upper surface of the dielectric layer 110 (or the upper surface of the hard mask layer) and is filled into the opening 112, in accordance with some embodiments. In some embodiments, the metal material 114 is formed on the glue layer. In the absence of the glue layer, the metal material 114 is in direct contact with the conductive feature 106, the dielectric layer 110 and ESL 108, in accordance with some embodiments.

In some embodiments, the metal material 114 is cobalt (Co), tungsten (W), ruthenium (Ru), or copper (Cu). In some embodiments, the metal material 114 is formed using CVD, physical vapor deposition (PVD), e-beam evaporation, ALD, electroplating (ECP), electroless deposition (ELD), another suitable method, or a combination thereof.

In some embodiments, the glue layer may be omitted based on the deposition technique implemented to deposit the metal material 114. In some embodiments, the metal material 114 is formed on the exposed portion of the upper surface of the conductive feature 106 (e.g., a metal surface) using a selective deposition process without depositing the metal material 114 on the dielectric material (e.g. the dielectric layer 110 and ESL 108). For example, a selective CVD may deposit a metal material (such as Co, W, Ru, Cu) on the conductive feature 106 in the opening 112 with a bottom-up growth and not significantly nucleate on a dielectric surface.

The metal material 114 includes a plurality of grains 116, as shown in FIG. 1D, in accordance with some embodiments. The grains 116 have grain boundaries 116B, in accordance with some embodiments.

In some embodiments, the grain size of a single grain 116 is calculated by measuring the maximum vertical dimension D1 and the maximum horizontal dimension D2 of a grain 116 in a cross-section, and dividing the sum of D1 and D2 by two. In some embodiments, the as-deposited metal material 114 has a first average grain size in a cross-section that is in a range from about 0.1 nm to about 4 nm. The cross-section of the metal material 114 may be taken by SEM or TEM technique.

Figure 1E:
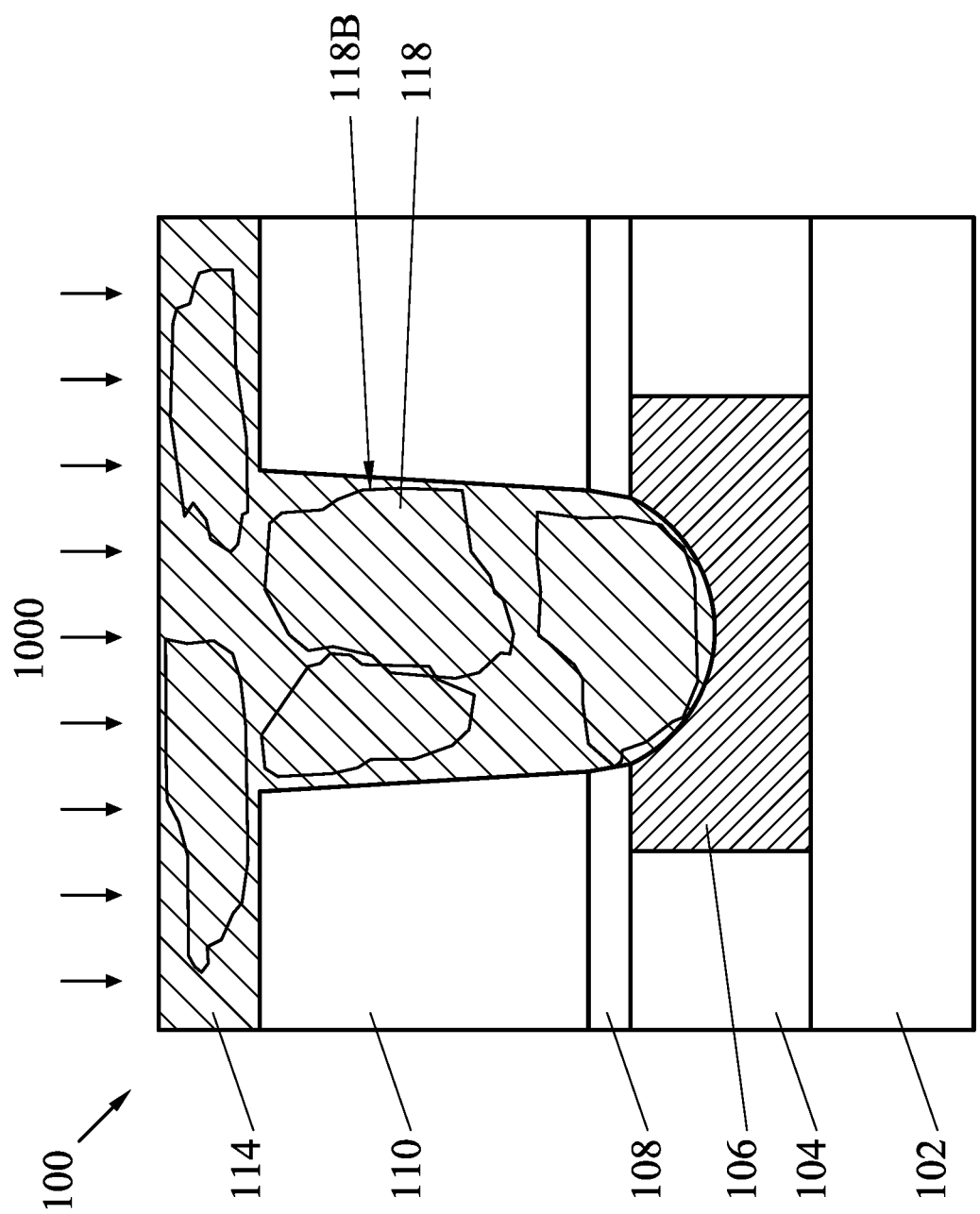

An anneal process 1000 is performed on the semiconductor structure 100, as shown in FIG. 1E, in accordance with some embodiments. During the anneal process 1000, the grains 116 of the metal material 114 undergo a grain growth due to recrystallization, in accordance with some embodiments. After the anneal process 1000, the regrown grains of the metal material 114 are labeled as grains 118, in accordance with some embodiments. The metal material 114 with a greater grain size reduce the resistance of the resulting electrical connection structure, in accordance with some embodiments.

After the anneal process 1000, the grains 118 of the metal material 114 has a second average grain size in a cross-section that is greater than the first average grain size of the as-deposited grains 116. In some embodiments, the second average grain size of the grains 118 of the metal material 114 is in a range from about 5 nm to about 13 nm. In some embodiments, the ratio of the second average grain size to the first average grain size is in a range from about 2 to about 150.

In addition, the anneal process 1000 releases the inner stress of the as-deposited metal material 114, which prevents the peeling issue of the metal material 114 during the following planarization process, in accordance with some embodiments.

In some embodiments, the anneal process 1000 is performed at a temperature ranging from about 100° C. to about 400° C. and for a time period ranging from about 1 minute to about 30 minutes. If the anneal temperature is too low, the grains 116 may not be regrown. If the anneal temperature is too high, the resistance of the resulting electrical connection structure may increase. This is described in detail below.

Figures 1, 1E:
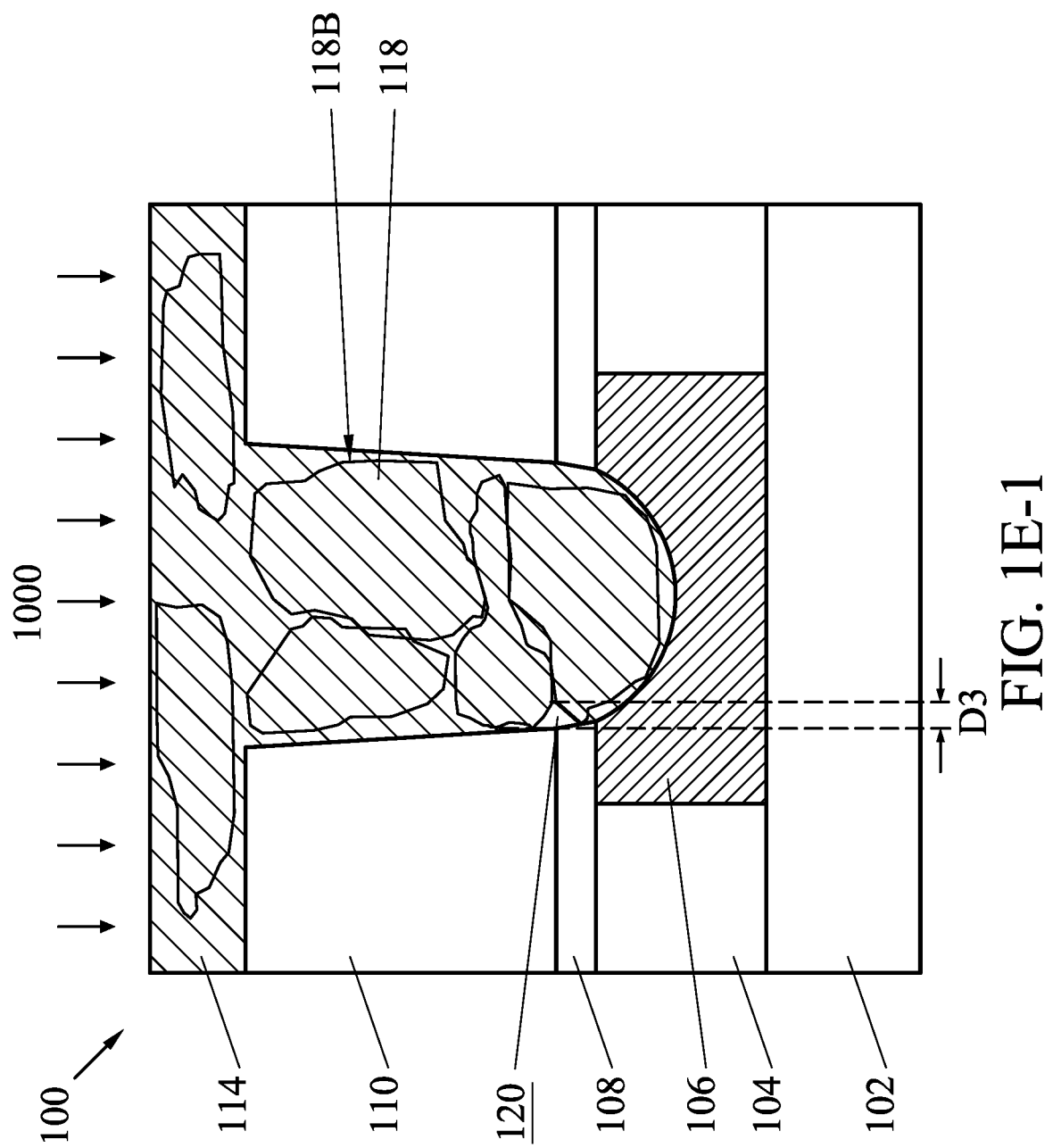

In some instance, especially in the absence of the glue layer, air voids may be formed on the sidewall of the metal material 114 due to the grain growth of the metal material 114. An air void 120 is formed on the sidewall of the metal material 114, as shown in FIG. 1E-1, in accordance with some embodiments. The air void 120 is formed between the metal material 114 and the dielectric material of the dielectric layer 110 and/or ESL 108, in accordance with some embodiments. Because the atoms of the metal material 114 have high mobility along the grain boundary and no glue layer is formed between the metal material 114 and the dielectric layer 110, the air void 120 may tend to form on the grain boundary between two neighboring grain 118.

In some embodiments, the air void 120 has a dimension D3 ranging from about 0.2 nm to about 0.5 nm. The dimension D3 of the air void 120 is small enough, and therefore the air void 120 does not substantially increase the resistance of the resulting electrical connection structure, in accordance with some embodiments.

However, if the anneal temperature is above 400° C., the dimension D3 of the air void 120 may increase dramatically due to grain growth of the metal material 114. The air void 120 having a large dimension D3 may cause the current crowding effect thereby increasing the resistance of the resulting electrical connection structure. Furthermore, if the anneal temperature is above 400° C., the likelihood of formation of an air void 120 may dramatically increase.

In an example in which glue layer is not formed, when the anneal process is performed at 450° C., the possibility of the formation of an air void 120 in a cross-section is greater than about 64%, the average of the dimension D3 of the air void 120 is 0.93 nm, and the maximum dimension D3 of the air void 120 is greater than 1.62 nm.

Figure 1F:
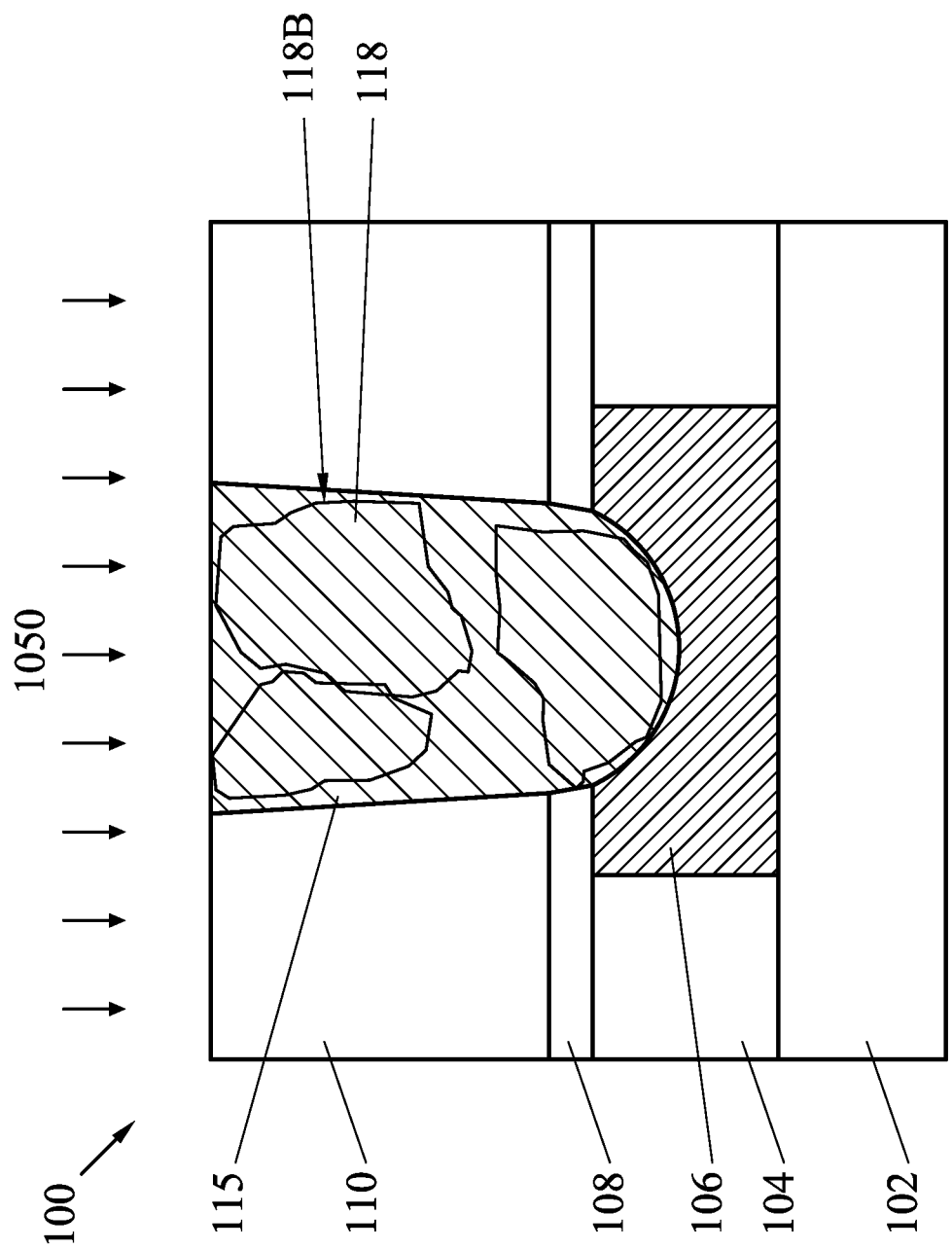

A planarization process 1050 is performed on the semiconductor structure 100, as shown in FIG. 1F, in accordance with some embodiments. The planarization process 1050 may be a chemical mechanical polishing (CMP) process. The planarization process 1050 removes a portion of the metal material 114 from the upper surface of the dielectric layer 110 to expose the upper surface of the dielectric layer 110, in accordance with some embodiments. After the planarization process 1050, the remaining portion of the metal material 114 is referred to as a conductive feature 115, in accordance with some embodiments.

Figure 1G:
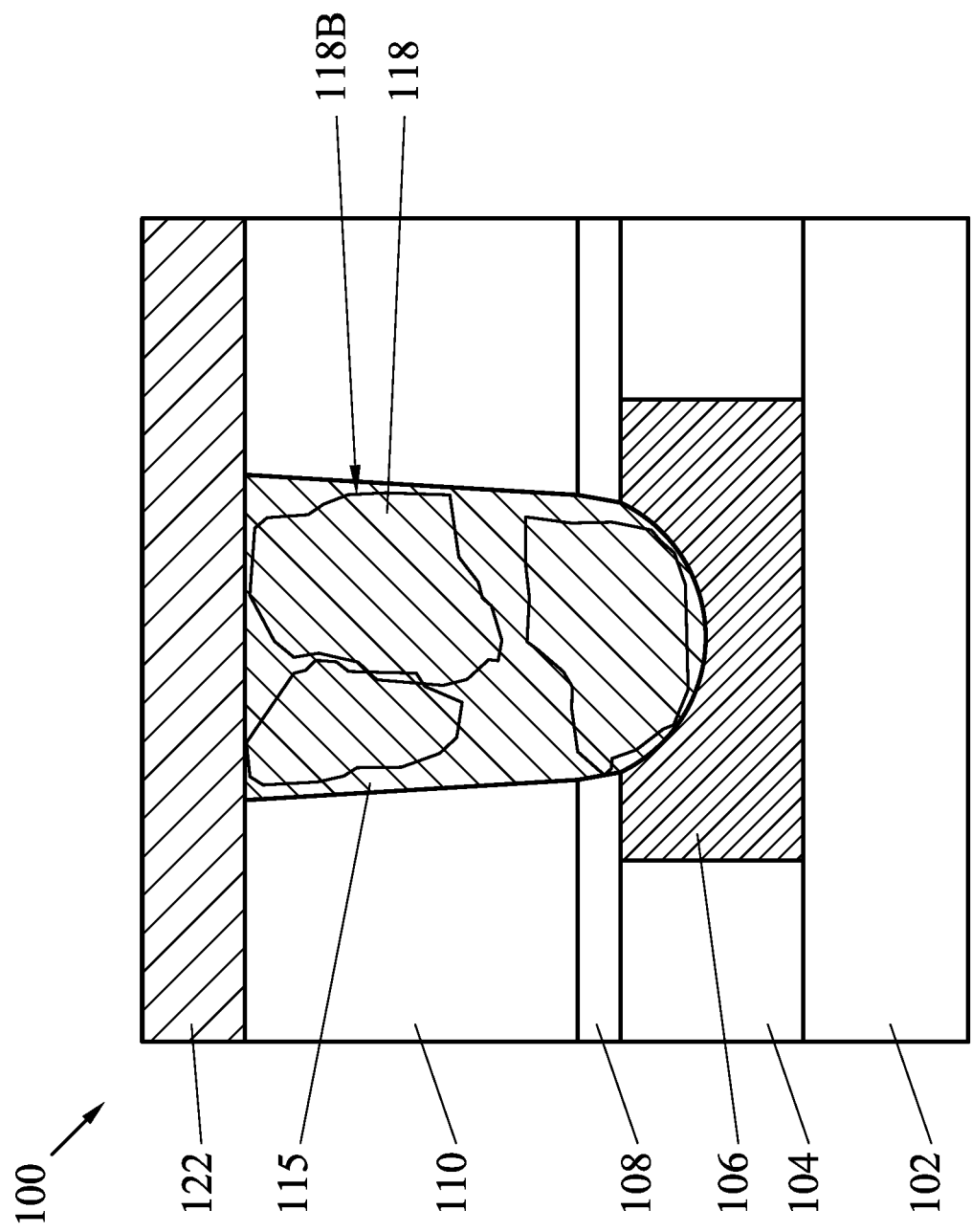

After the planarization process 1050, a clean process is performed on the semiconductor structure 100, in accordance with some embodiments. The clean process removes a native oxide formed on the exposed upper surface of the conductive feature 115. In some embodiments, the clean process is performed using $H_2$ radical clean A metal material 122 is formed over the semiconductor structure 100, as shown in FIG. 1G, in accordance with some embodiments. The metal material 122 is formed over the upper surface of the dielectric layer 110 and the upper surface of the conductive feature 115, in accordance with some embodiments. The metal material 122 is used to dope the conductive feature 115, in accordance with some embodiments. In some embodiments, the metal material 122 has a thickness ranging from about 1 nm to about 5 nm.

In some embodiments, the metal material 122 is cobalt (Co), tungsten (W), ruthenium (Ru), or a compound or an alloy based on Co, W, or Ru (i.e. main component is Co, W, or Ru). The compound or alloy of the metal material 122 may be formed by adding other elements, such as Ag, Cu, Au, Al, Ca, Be, Mg, Rh, Na, Ir, W, Mo, Zn, Ni, K, Co, Cd, Ru, In, Os, Si, and/or Ge, into the based metal (Co, W, or Ru). In some embodiments, the metal material 122 is formed using CVD, PVD, e-beam evaporation, ALD, ECP, ELD, another suitable method, or a combination thereof.

The metal material 122 is different than the metal material 114, in accordance with some embodiments. The metal material 122 has an oxidation/reduction potential that is close to but different than the oxidation/reduction potential of the metal material 114, in accordance with some embodiments.

In some embodiments, the metal material 114 has a first oxidation/reduction potential, the metal material 122 has a second oxidation/reduction potential. In some embodiments, the absolute value of the difference between the first oxidation/reduction potential and the second metal material is greater than 0 and less than 6V. For example, the metal material 114 is ruthenium and the metal material 122 is cobalt. The absolute value of the oxidation/reduction potential difference between the ruthenium and cobalt is 0.17V.

If the oxidation/reduction potential difference of the metal material 114 and 122 is too large, a galvanic reaction may occur during the following processes (such as CMP process). The galvanic current between the conductive feature 115 and the metal material 122 may cause the corrosion of the conductive feature 115 and/or the metal material 122.

Figure 1H:
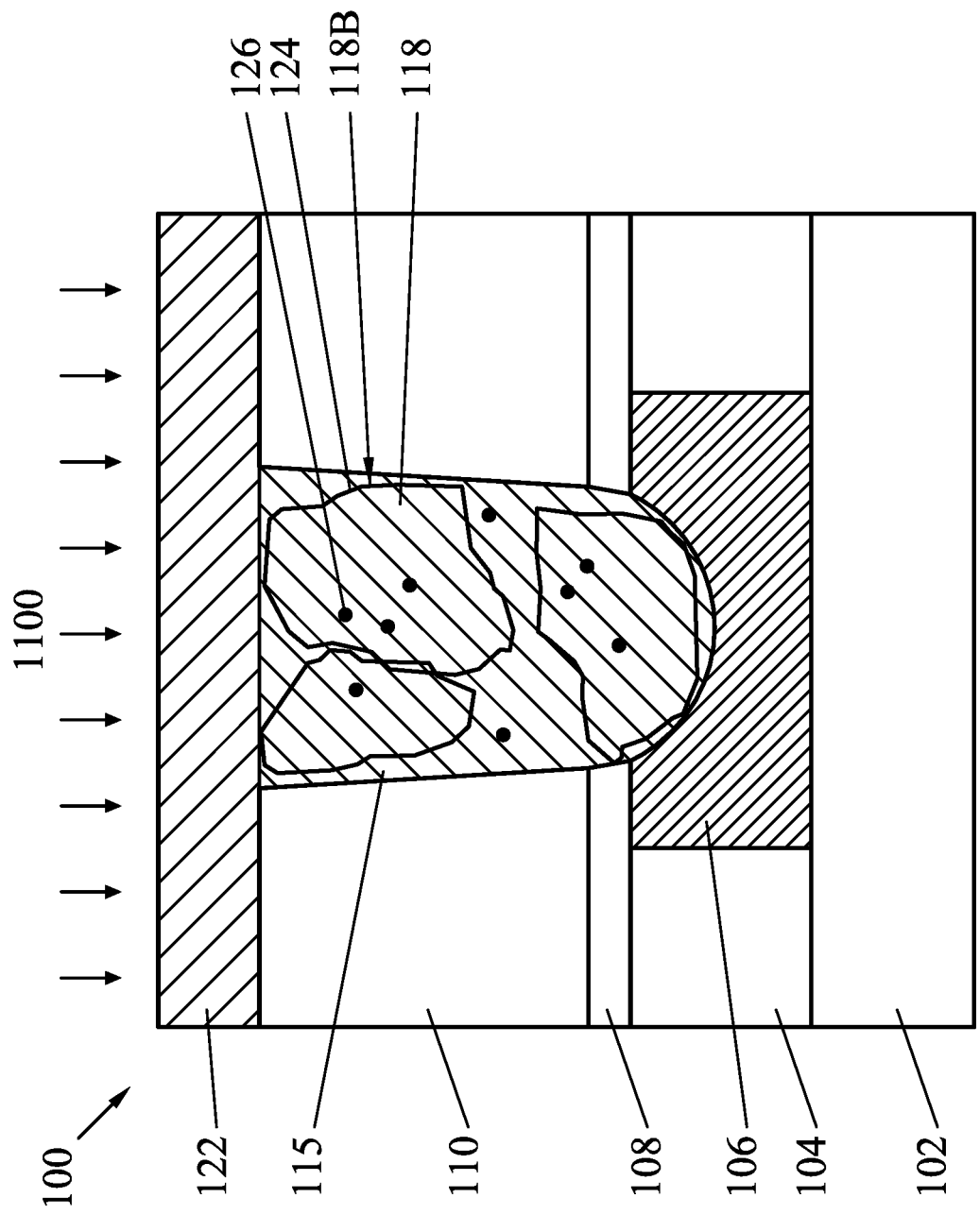

An anneal process 1100 is performed on the semiconductor structure 100, as shown in FIG. 1H, in accordance with some embodiments. During the anneal process 1100, the conductive feature 115 is doped with the metal material 122, in accordance with some embodiments. Because the atoms of the metal material 122 have high mobility along the grain boundaries 118B, the metal material 122 is annealed to diffuse along the grain boundaries 118B of the grains 118 of the conductive feature 115, in accordance with some embodiments. In some embodiments, the metal material 114 of the conductive feature 115 does not form an alloy with the metal material 114 during the anneal process 1100.

The portion of the metal material 122 along the grain boundaries 118B of the grains 118 of the conductive feature 115 forms an inhibition layer 124, in accordance with some embodiments. The inhibition layer 124 inhibits a further grain growth of the grains 118 of the conductive feature 115 during the manufacture of the semiconductor device, e.g., in high-temperature processes such as anneal processes, diffusion process, and/or CVD processes, in accordance with some embodiments. The further grain growth of the grains 118 of the conductive feature 115 may increase the likelihood of the formation of an air void and the dimension of the air void, which may increase the resistance of the resulting electrical connection structure and reduce the reliability of the semiconductor device having the electrical connection structure.

The inhibition layer 124 extends along the grain boundaries 118B of the grains 118, in accordance with some embodiments. In some embodiments, the inhibition layer 124 extends along the sidewalls of the conductive feature 115. In some embodiments, each of the grains 118 is partially or entirely surrounded by the inhibition layer 124. The inhibition layer 124 is also formed along the surfaces of the air void 120, as shown in FIG. 1H-1, in accordance with some embodiments.

In some embodiments, after the anneal process 1100, the grains 118 of the conductive feature 115 has a third average grain size in a cross-section that is substantially the same as the second average grain size of the metal material 114. In some embodiments, the third average grain size of the grains 118 of the conductive feature 115 is in a range from about 5 nm to about 15 nm. In some embodiments, the ratio of the third average grain size to the second average grain size is in a range from about ⅓ to about 3.

The temperature of the anneal process 1100 is greater than the temperature of the anneal process 1000, in accordance with some embodiments. In some embodiments, the anneal process 1100 is performed at a temperature ranging from about 200° C. and 500° C. and for a time period ranging from about 1 minute to about 30 minutes. If the anneal temperature is too low, the metal material 122 may not diffuse to the grains at the lower portion of the conductive feature 115. If the anneal temperature is too high, the metal material 114 of the conductive feature 115 may form an alloy with the metal material 122. The alloy may increase the resistance of the resulting electrical connection structure.

In addition, during the anneal process 1100, the metal material 122 also diffuses to vacancies in the grains 118 of the conductive feature 115 to form metal agglomerates 126, as shown in FIG. 1H, in accordance with some embodiments. The vacancies are defects of as-deposited metal material 114, in accordance with some embodiments.

Figure 1I:
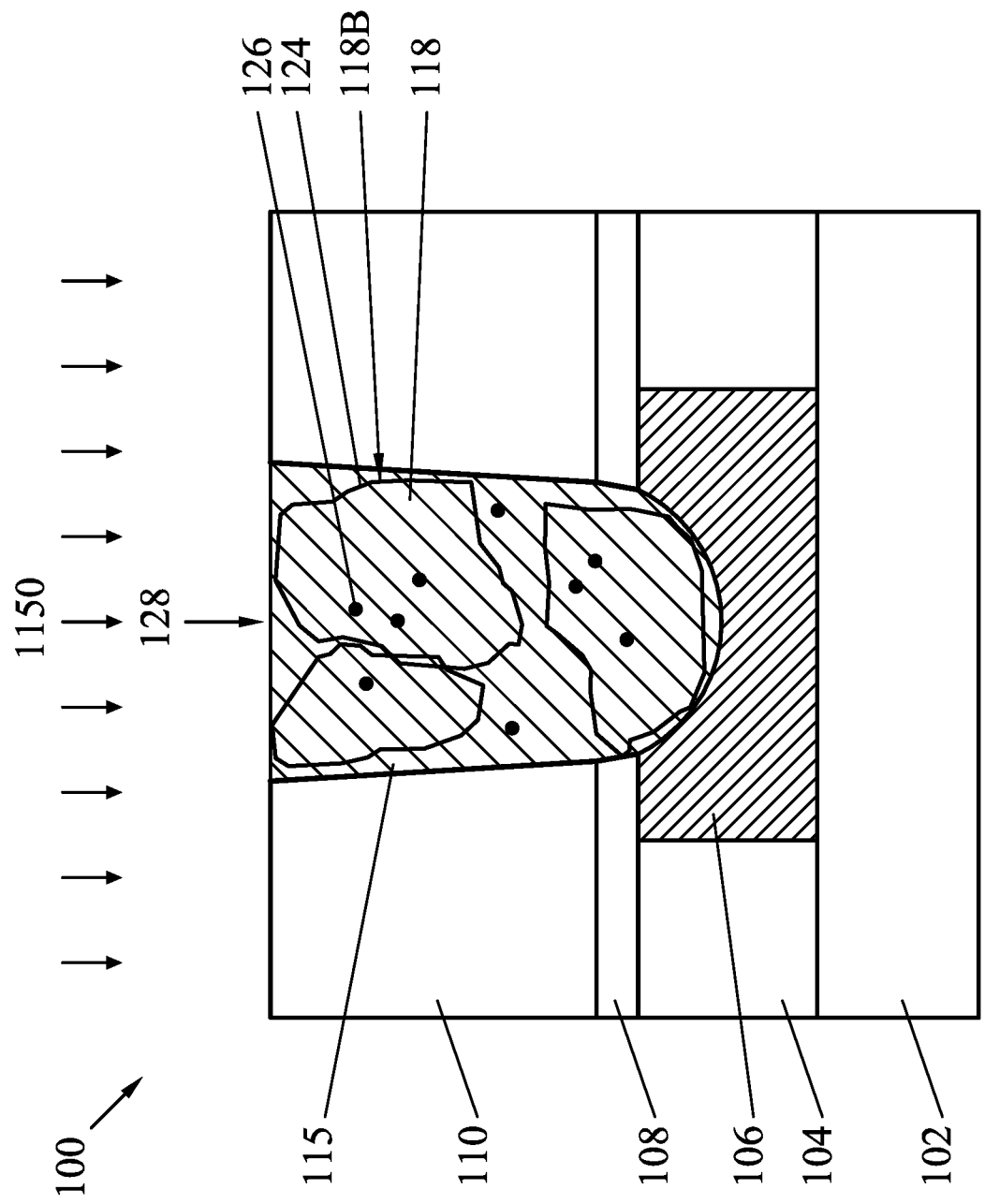
Figures 1, 1I:
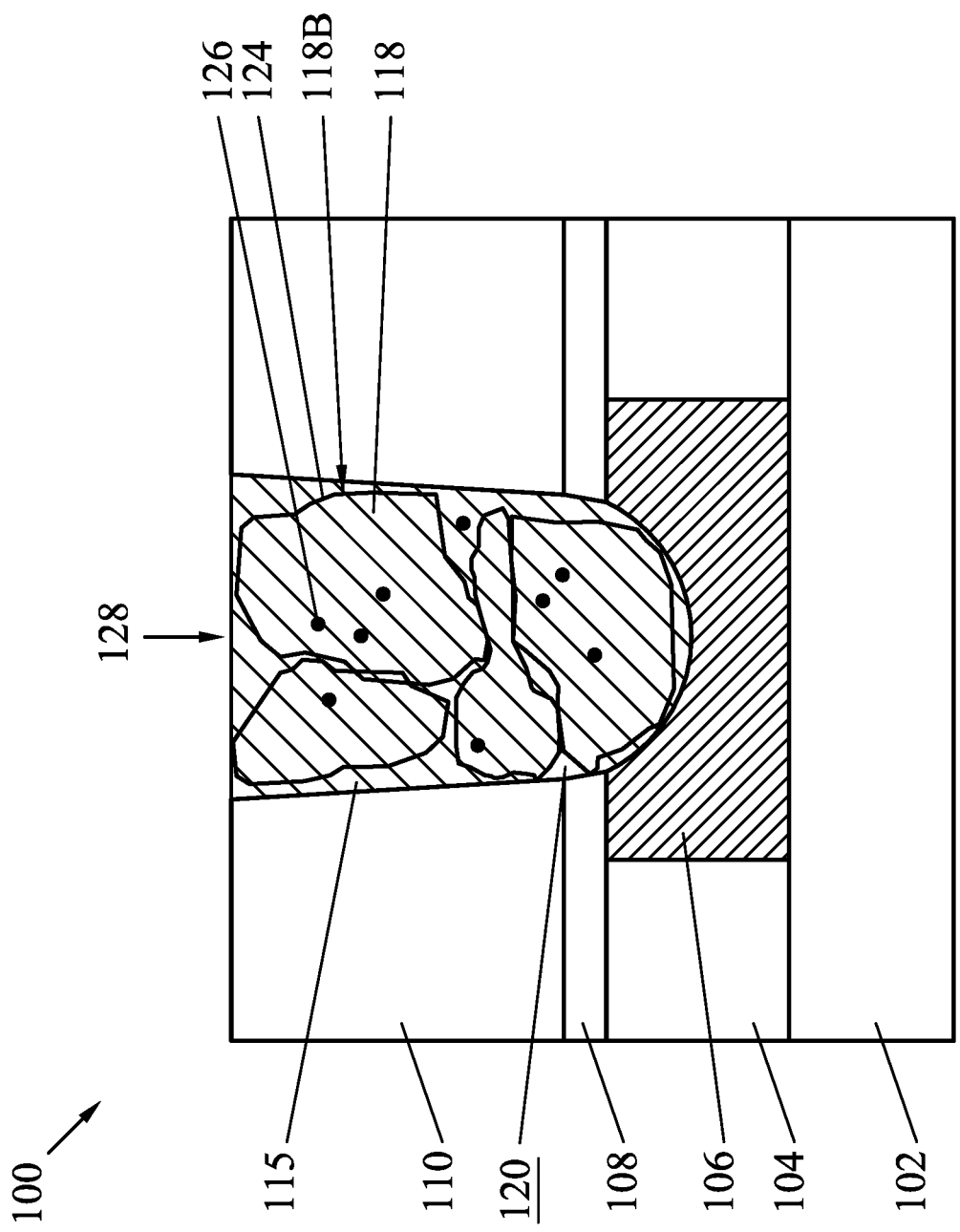

A planarization process 1150 is performed on the semiconductor structure 100, as shown in FIG. 1I, in accordance with some embodiments. The planarization process 1150 may be a CMP process. The planarization process 1150 removes the metal material 122 from the upper surface of the dielectric layer 110 and the upper surface of the conductive feature 115, in accordance with some embodiments. After the planarization process 1150, the upper surface of the dielectric layer 110 and the upper surface of the conductive feature 115 are exposed, in accordance with some embodiments. After the planarization process 1150, the conductive feature 115 and the inhibition layer 124 forms an electrical connection structure 128, in accordance with some embodiments.

The air void 120 may be formed on the sidewall of the electrical connection structure 128, as shown in FIG. 1I-1. In an example in which glue layer is not formed, by utilizing the method described above to form the electrical connection structure 128, the possibility of the formation of an air void 120 in a cross-section may be reduced to less than about 15%, the average of the dimension D3 of the air void 120 may be reduced to less 0.7 nm, and the maximum dimension D3 of the air void 120 is less than 1 nm.

In some embodiments, the conductive feature 106 is a conductive region, a source/drain feature, or a gate stack of a transistor, the electrical connection structure 128 is a contact or a plug to the conductive region, the source/drain feature, or the gate stack.

In some embodiments, the conductive feature 106 is a contact or a plug to a source/drain feature or to a gate stack, the electrical connection structure 128 is a via to the contact or a plug.

In some embodiments, the conductive feature 106 is a metal line in the IMD layer, the electrical connection structure 128 is a via to the metal line.

The electrical connection structure 128 includes an inhibition layer 124 formed along the grain boundaries 118B of the conductive feature 115, in accordance with some embodiments. The inhibition layer 124 inhibits the grain growth of the conductive feature 115 during the manufacture of the semiconductor device, thereby reducing the likelihood of the formation of an air void 120 on the sidewall of the electrical connection structure 128 and the dimension of the air void 120, in accordance with some embodiments. As a result, the reliability of the semiconductor device having the electrical connection structure 128 can be enhanced.

Figure 2:
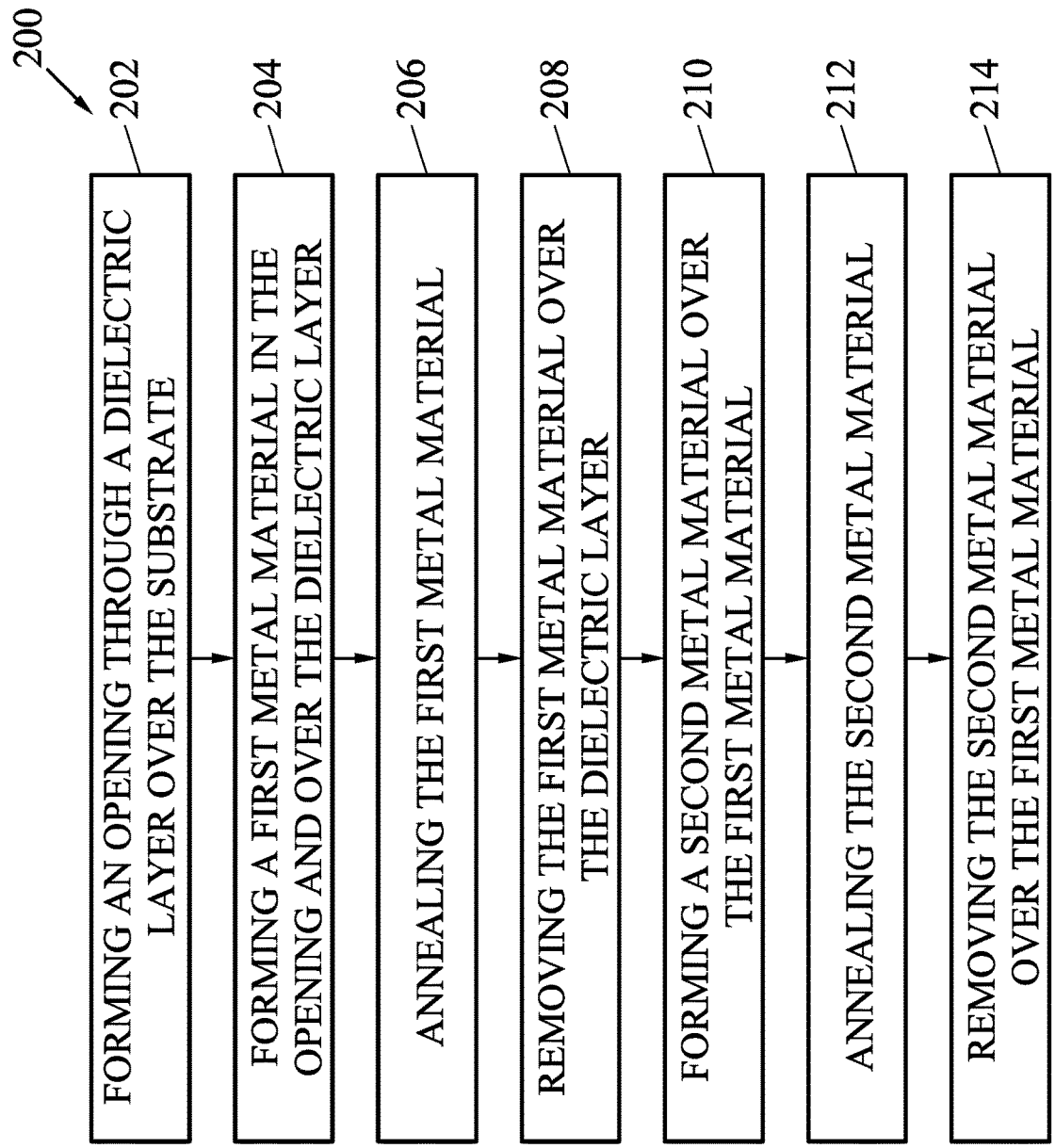
FIG. 2 is a flow chart of an example method for forming an electrical connection structure, in accordance with some embodiments of the disclosure.

FIG. 2 is a flow chart 200 of an example method for forming an electrical connection structure, in accordance with some embodiments of the disclosure. In operation 202, an opening is formed through a dielectric layer over the substrate, in accordance with some embodiments of the disclosure. An example of operation 202 is illustrated in and described with respect to FIG. 1C. For example, an opening 112 is formed through the dielectric layer 110 and ESL 108, in accordance with some embodiments of the disclosure.

In operation 204, a first metal material is formed in the opening and over the dielectric layer, in accordance with some embodiments of the disclosure. An example of operation 204 is illustrated in and described with respect to FIG. 1D. For example, a metal material 114 is formed in the opening 112 and over the dielectric layer 110, in accordance with some embodiments.

In operation 206, the first metal material is annealed, in accordance with some embodiments of the disclosure. An example of operation 206 is illustrated in and described with respect to FIG. 1E. For example, the metal material 114 is annealed for grain growth, in accordance with some embodiments.

In operation 208, the first metal material over the dielectric layer is removed, in accordance with some embodiments of the disclosure. An example of operation 208 is illustrated in and described with respect to FIG. 1F. For example, the metal material 114 over the dielectric layer 110 is removed to form a conductive feature 115, in accordance with some embodiments.

In operation 210, a second metal material is formed over the first metal material, in accordance with some embodiments of the disclosure. An example of operation 210 is illustrated in and described with respect to FIG. 1G. For example, a metal material 122 is formed over the conductive feature 115, in accordance with some embodiments.

In operation 212, the second metal material is annealed, in accordance with some embodiments of the disclosure. An example of operation 212 is illustrated in and described with respect to FIG. 1H. For example, the metal material 122 is annealed to form inhibition layer 124 in the conductive feature 115, in accordance with some embodiments.

In operation 214, the second metal material over the first metal material is removed, in accordance with some embodiments of the disclosure. An example of operation 214 is illustrated in and described with respect to FIG. 1I. For example, the metal material 122 over the conductive feature 115 is removed to from the electrical connection structure 128, in accordance with some embodiments.

Figure 3A:
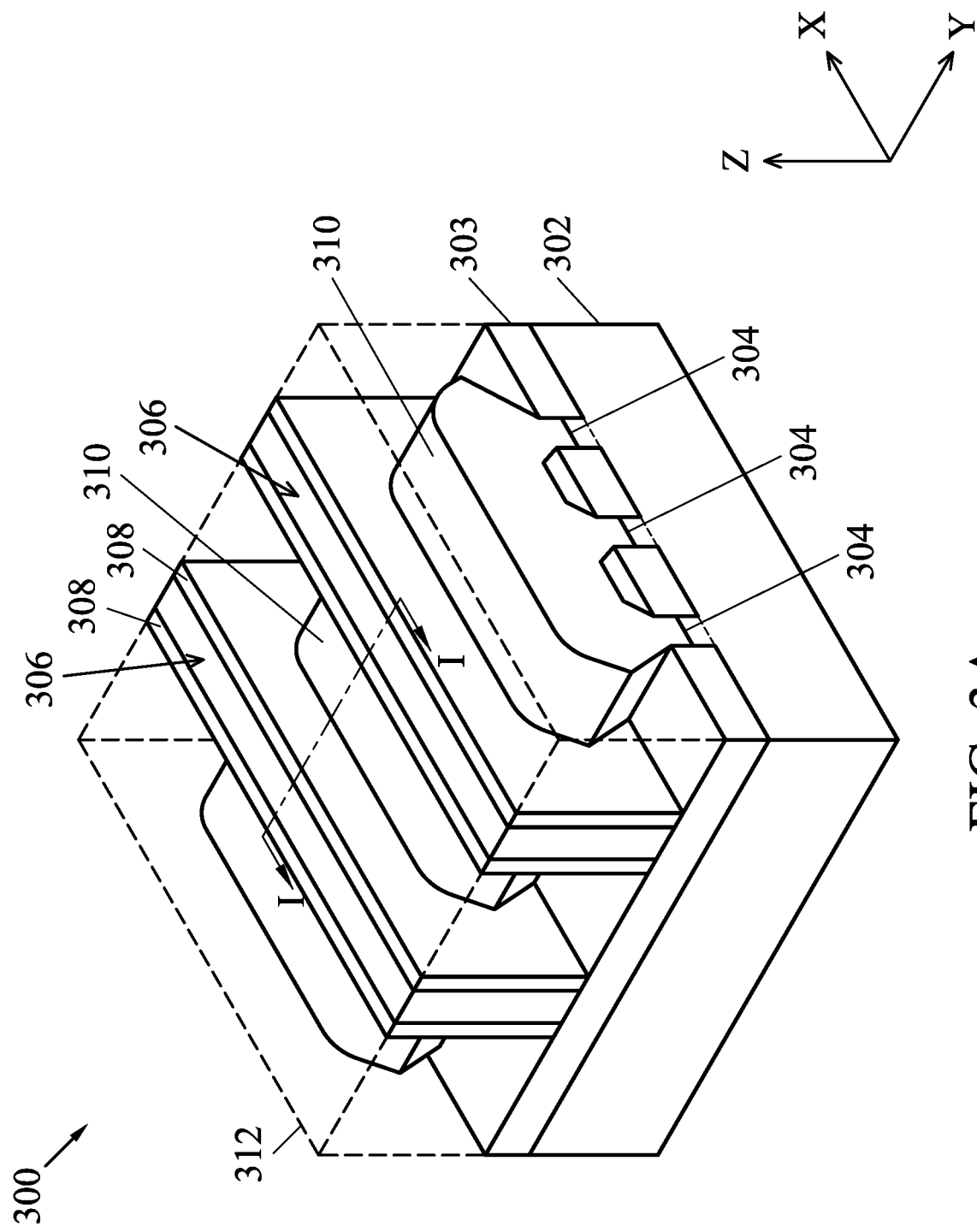
FIG. 3A is a perspective view of a FinFET device, in accordance with some embodiments of the disclosure.
Figure 3B:
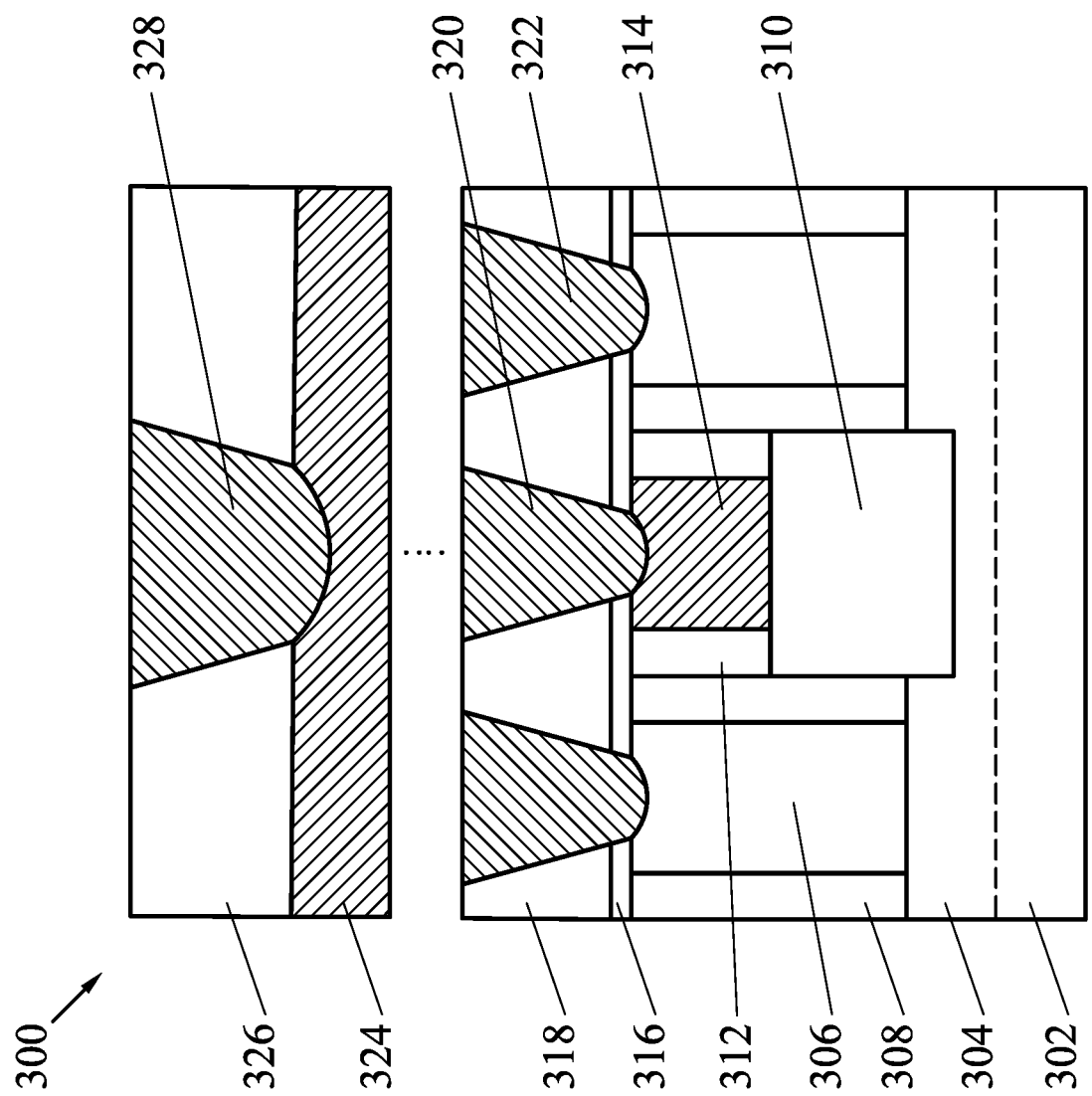
FIG. 3B is a cross-sectional view of a FinFET device having various electrical connection structures along line I-I in FIG. 3A, in accordance with some embodiments of the disclosure.

FIGS. 1A through 1I-1 and 2 illustrate a method for forming an electrical connection structure. FIGS. 3A and 3B illustrate a FinFET device having the electrical connection structures that is formed by the method described in FIGS. 1A through 1I-1 and 2.

FIG. 3A is a perspective view of a FinFET device 300, in accordance with some embodiments of the disclosure. FIG. 3B is a cross-sectional view of a FinFET device 300 having various electrical connection structures along line I-I in FIG. 3A, in accordance with some embodiments of the disclosure.

The FinFET device 300 includes a substrate 302, in accordance with some embodiments. The substrate 302 may be substantially similar to the substrate 102 described above in FIG. 1A, in accordance with some embodiments.

The FinFET device 300 includes fin structures 304 and an isolation structure 303 formed over the substrate 302, in accordance with some embodiments. The fin structures 304 protrude from the upper surface of the substrate 302, in accordance with some embodiments. The fin structures 304 are arranged in the X direction and extend in the Y direction, in accordance with some embodiments. The isolation structure 303 surrounds the fin structures 304, in accordance with some embodiments.

In some embodiments, the fin structures 304 are formed by a portion of the substrate 302. For example, a patterning process may be performed on the substrate 302 to form the fin structures 304. In some embodiments, the isolation structure 303 is formed of a dielectric material such as silicon oxide, silicon nitride, silicon oxynitride (SiON), another suitable dielectric material, and/or a combination thereof. In some embodiments, the isolation structure 303 is formed by depositing a dielectric material over the fin structures 304, and recessing the dielectric material.

The FinFET device 300 includes gate stacks 306 and gate spacer layers 308 formed over the substrate 302, in accordance with some embodiments. The gate stacks 306 are formed across the fin structures 304, in accordance with some embodiments. The gate stacks 306 are arranged in the Y direction and extend in the X direction, in accordance with some embodiments. The gate spacer layers 308 are formed along the opposite sidewalls of the gate stacks 306, in accordance with some embodiments.

In some embodiments, the gate stack 306 includes a gate dielectric layer and a gate electrode layer formed on the gate dielectric layer. In some embodiments, the gate dielectric layer is conformally formed along the upper surface of the isolation structure 203 and the sidewalls and the upper surfaces of the fin structures 304.

In some embodiments, the gate dielectric layer is formed of one or more dielectric materials, such as silicon oxide, silicon nitride, silicon oxynitride (SiON), and/or a combination thereof. In some embodiments, the gate dielectric layer is formed of a dielectric material with high dielectric constant (k value), for example, greater than 3.9. In some embodiments, the high-K dielectric material includes $HfO_2$, HfZrO, HfSiO, HfTiO, HfAlO, another suitable high-K dielectric material, and/or a combination thereof.

In some embodiments, the gate electrode layer is formed of one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, another suitable material, and/or a combination thereof.

In some embodiments, the gate spacer layer 308 is formed of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), and/or a combination thereof.

The FinFET device 300 includes source/drain features 310 formed on the fin structures 304, in accordance with some embodiments. The source/drain features 310 are formed on the opposite sides of the gate stack 306, in accordance with some embodiments. In some embodiments, the source/drain features 310 on the adjacent fin structures 304 merge to form a continuous source/drain feature 310, as shown in FIG. 3A. In some embodiments, the source/drain features 310 on the adjacent fin structures 304 do not merge together and remain separate source/drain feature 310.

In some embodiments, the source/drain features 310 are formed of any suitable material for an n-type semiconductor device and a p-type semiconductor device, such as Ge, Si, GaAs, AlGaAs, SiGe, GaAsP, SiP, SiC, SiCP, or a combination thereof. In some embodiments, the source/drain features 310 are formed by recessing the fin structure 304, and depositing a semiconductor material on the recessed fin structure 304. The deposition process may include an epitaxial growth process.

In some embodiments, the source/drain features 310 are in-situ doped during the epitaxial growth process. For example, the source/drain features 310 may be the epitaxially grown SiGe doped with boron (B). For example, the source/drain features 310 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain features 310 are doped in one or more implantation processes after the epitaxial growth process.

The FinFET device 300 includes a lower ILD layer 312 over the substrate 302, in accordance with some embodiments. The lower ILD layer 312 covers the source/drain features 310, in accordance with some embodiments. The lower ILD layer 312 has an upper surface substantially coplanar with the upper surfaces of the gate stacks 306, in accordance with some embodiments. In some embodiments, the lower ILD layer 312 is formed of a dielectric material, such as silicon oxide ($SiO_2$), silicon nitride (SiN), silicon oxynitride (SiON), silicon carbon nitride (SiCN), TEOS oxide, USG, BPSG, FSG, PSG, BSG, or another suitable dielectric material.

In some embodiments, the FinFET device 300 is formed using a gate-late process. For example, a dummy gate structures may be formed on the fin structure 304. After the lower ILD layer 312 is formed, the dummy gate structures are replaced with the gate stacks 306.

A source/drain contact 314 is formed through the lower ILD layer 312 and over the source/drain feature 310, as shown in FIG. 3B, in accordance with some embodiments.

The source/drain contact 314 may be formed using the method described above in FIGS. 1A through 1I-1 and 2. For example, in operation 202, an opening may be formed through the lower ILD layer 312 to expose the upper surface of the source/drain feature 310. In operation 204, a first metal material may be formed in the opening and over the lower ILD layer 312. In operation 206, the first metal material may be annealed for grain growth. In operation 208, the first metal material over the lower ILD layer 312 may be removed to form a conductive feature in the opening. In operation 210, a second metal material may be formed over the conductive feature. In operation 212, the second metal material may be annealed to form an inhibition layer in the conductive feature. In operation 214, the second metal material over the conductive feature may be removed. The first metal material and the second metal material may be the same as the metal material 114 and the metal material 122 respectively. The conductive feature and the inhibition layer together form the source/drain contact 314.

Before forming the first metal material, a silicide layer may be formed on the source/drain feature 210 in the opening. The silicide layer may be used to decrease the resistance between the source/drain contact 314 and the source/drain feature 310.

A contact etching stop layer (CESL) 316 is formed over the lower ILD layer 312, as shown in FIG. 3B, in accordance with some embodiments. The CESL 316 covers the gate stacks 306, the gate spacer layers 308, and the source/drain contact 314, in accordance with some embodiments. An upper ILD layer 318 is formed over the CESL 316, in accordance with some embodiments.

In some embodiments, the CESL 316 is formed of a dielectric layer, such as silicon oxide ($SiO_2$), silicon nitride (SiN), oxygen-doped silicon carbide (SiC:O), oxygen-doped silicon carbon nitride (SiCN:O), or a combination thereof. In some embodiments, the CESL 316 is formed using CVD (such as LPCVD, PECVD, HDP-CVD, HARP, and FCVD), ALD, another suitable method, or a combination thereof.

In some embodiments, the upper ILD layer 318 is formed of a dielectric layer, such as silicon oxide ($SiO_2$), silicon nitride (SiN), silicon oxynitride (SiON), silicon carbon nitride (SiCN), TEOS oxide, USG, BPSG, FSG, PSG, BSG, or another suitable dielectric material. In some embodiments, the upper ILD layer 318 is formed using CVD (such as LPCVD, PECVD, HDP-CVD, HARP, and FCVD), ALD, another suitable method, or a combination thereof.

A source/drain via 320 and gate vias 322 are formed through the upper ILD layer 318 and the CESL 316, as shown in FIG. 3B, in accordance with some embodiments. The source/drain via 320 lands on and is in direct contact with the source/drain contact 314, in accordance with some embodiments. The gate vias 322 land on the gate stacks 306 and are in direct contact with the gate electrode layers of the gate stacks 306, in accordance with some embodiments.

The source/drain via 320 may be formed using the method described above in FIGS. 1A through 1I-1 and 2. For example, in operation 202, an opening may be formed through the upper ILD layer 318 and the CESL 316 to expose the upper surface of the source/drain contact 314. In operation 204, a third metal material may be formed in the opening and over the upper ILD layer 318. In operation 206, the third metal material may be annealed for grain growth. In operation 208, the third metal material over the upper ILD layer 318 may be removed to form a conductive feature in the opening. In operation 210, a fourth metal material may be formed over the conductive feature. In operation 212, the fourth metal material may be annealed to form an inhibition layer in the conductive feature. In operation 214, the fourth metal material over the conductive feature may be removed. The third metal material and the fourth metal material may be the same as the metal material 114 and the metal material 122 respectively. The conductive feature and the inhibition layer together form the source/drain via 320. The conductive feature is Ru and the inhibition layer is Co, in accordance with some embodiments.

The third metal material is formed using a selective deposition technique such as cyclic CVD process or ELD process, and therefore it is not necessary to form glue layer in the opening before forming the third metal material, in accordance with some embodiments. The source/drain via 320 is in direct contact with the upper ILD layer 318 and the CESL 316, in accordance with some embodiments. As a result, the source/drain via 320 may have a lower resistance, which enhances the performance of the FinFET device 300.

In some embodiments, the gate vias 322 may be formed simultaneously the source/drain vias 320 by the method described above in FIGS. 1A through 1I-1 and 2. In some embodiments, the gate vias 322 may be formed separately from the source/drain vias 320.

One or more IMD layers 326 are formed over the upper ILD layer 318, as shown in FIG. 3B, in accordance with some embodiments. In some embodiments, each of the IMD layers 326 is formed of one or more dielectric materials, such as silicon oxide, silicon carbide, a low-k dielectric material, silicon oxynitride, PSG, BSG, BPSG, USG, FSG, OSG, SiOC, Spin-On-Glass, Spin-On-Polymers, silicon carbon material, or a combination thereof. In some embodiments, the IMD layers 326 are formed using CVD (such as LPCVD, PECVD, HDP-CVD, HARP, and FCVD), ALD, spin-on coating, another suitable method, or a combination thereof.

A metal line 324 and a via 328 are formed in each of the IMD layer 326, as shown in FIG. 3B, in accordance with some embodiments. The via 328 is formed on the metal line 324, in accordance with some embodiments.

The metal line 324 is formed of copper (Cu), cobalt (Co), ruthenium (Ru), molybdenum (Mo), multilayers thereof, an alloy thereof, and/or a combination thereof. In some embodiments, the metal line 324 is formed using a damascene process, or a deposition process followed by an etching process.

The via 328 may be formed using the method described above in FIGS. 1A through 1I-1 and 2. For example, in operation 202, an opening may be formed through the IMD layer 326 to expose the upper surface of metal line 324. In operation 204, a fifth metal material may be formed in the opening and over the IMD layer 326. In operation 206, the fifth metal material may be annealed for grain growth. In operation 208, the fifth metal material over the IMD layer 326 may be removed to form a conductive feature in the opening. In operation 210, a sixth metal material may be formed over the conductive feature. In operation 212, the sixth metal material may be annealed to form an inhibition layer in the conductive feature. In operation 214, the sixth metal material over the conductive feature may be removed. The fifth metal material and the sixth metal material may be the same as the metal material 114 and the metal material 122 respectively. The conductive feature and the inhibition layer together form the via 328.

As described above, the method for forming an electrical connection structure 128 includes forming a metal material 114 in an opening 112 of a dielectric layer 110, 108, forming a metal material 122 over the metal material 114, annealing the metal material 122 so that the metal material 122 diffuses along the grain boundaries 118B of the grains 118 of the metal material 114, in accordance with some embodiments. The metal material 122 along the grain boundaries 118B inhibits the grain growth of the metal material 114 during the manufacture of the semiconductor device, thereby reducing the likelihood of the formation of an air void 120 on the sidewall of the electrical connection structure 128 and the dimension of the air void 120, in accordance with some embodiments. As a result, the reliability of the semiconductor device having the electrical connection structure can be enhanced.

Embodiments of a method for forming an electrical connection structure may be provided. The method may include forming a first metal material in an opening of a dielectric layer, forming a second metal material over the first metal material, annealing the second metal material. The second metal material may form an inhibition layer along the grain boundaries of the grains of the first metal material. Therefore, the likelihood of the formation of an air void on the sidewall of the electrical connection structure and the dimension of the air void may be reduced during the manufacture of the semiconductor device, which may enhance the reliability of the semiconductor device having the electrical connection structure.

In some embodiments, a semiconductor device structure is provided. The semiconductor device structure includes a substrate, a conductive feature on the substrate, and an electrical connection structure on the conductive feature. The electrical connection includes a first grain made of a first metal material, and a first inhibition layer made of a second metal layer that is different than the first metal material. The first inhibition layer extends vertically along a first side of a grain boundary of the first grain and laterally along a bottom of the grain boundary of the first grain.

In some embodiments, a semiconductor device structure is provided. The semiconductor device structure includes a transistor over a substrate, a contact plug on a source/drain feature of the transistor, and a via on the contact plug. The via includes a plurality of grains made of a first metal material, and an inhibition layer made of a second metal layer that is different than the first metal material. The inhibition layer includes a first portion laterally sandwiched between a first grain and a second grain of the plurality of grains and a second portion vertically sandwiched between the first grain and a third grain of the plurality of grains.

In some embodiments, a method for forming a semiconductor device structure is provided. The method includes forming a dielectric layer over a substrate, etching the dielectric layer to form an opening, depositing a first metal material in the opening, forming a second metal material over the first metal material and the dielectric layer, diffusing the second metal material along grain boundaries of grains of the first metal material, thereby forming an inhibition layer, and polishing the second metal material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate;
   a conductive feature on the substrate; and
   an electrical connection structure on the conductive feature, wherein the electrical connection structure comprises:
      a first grain made of a first metal material; and
      a second metal material extending vertically along a first side of a grain boundary of the first grain and laterally along a bottom of the grain boundary of the first grain, wherein the second metal material is different than the first metal material.

2. The semiconductor device structure as claimed in claim 1, wherein the electrical connection structure further comprises an agglomerate made of the second metal material, wherein the agglomerate is located within the first grain.

3. The semiconductor device structure as claimed in claim 1, wherein a portion of the second metal material extending laterally along the bottom of the grain boundary of the first grain is lower than a top surface of the conductive feature.

4. The semiconductor device structure as claimed in claim 1, wherein the substrate includes a field effect transistor, and the conductive feature is electrically connected to the field effect transistor.

5. The semiconductor device structure as claimed in claim 1, further comprising:
   a dielectric layer surrounding the electrical connection structure, wherein the electrical connection structure further comprises an air void exposing the dielectric layer and the second metal material.

6. The semiconductor device structure as claimed in claim 1, wherein the electrical connection structure further comprises:
   a second grain made of the first metal material; and
   a third metal material extending vertically along a first side of a grain boundary of the second grain and laterally along a bottom of the grain boundary of the second grain.

7. The semiconductor device structure as claimed in claim 1, wherein the second metal material extends vertically along a second side of the grain boundary of the first grain and laterally along a top of the grain boundary of the first grain.

8. The semiconductor device structure as claimed in claim 7, wherein the top of the grain boundary of the first grain is lower than a top surface of the electrical connection structure.

9. A semiconductor device structure, comprising:
   a transistor over a substrate;
   a contact plug on a source/drain feature of the transistor;
   a via on the contact plug, wherein the via comprises:
      a plurality of grains made of a first metal material; and
      a second metal material including a first portion laterally sandwiched between a first grain and a second grain of the plurality of grains and a second portion vertically sandwiched between the first grain and a third grain of the plurality of grains, wherein the second metal material is different than the first metal material.

10. The semiconductor device structure as claimed in claim 9, wherein the first metal material is ruthenium and the second metal material is cobalt.

11. The semiconductor device structure as claimed in claim 9, wherein the second metal material includes a third portion laterally sandwiched between the second grain and the third grain.

12. The semiconductor device structure as claimed in claim 9, wherein the via further includes a plurality of agglomerates made of the second metal material, and the plurality of agglomerates are separate from each other.

13. The semiconductor device structure as claimed in claim 12, wherein the plurality of agglomerates is embedded within the first grain.

14. A semiconductor device structure, comprising:
   a substrate;
   a conductive feature on the substrate; and
   an electrical connection structure on the conductive feature, wherein the electrical connection structure includes a first grain of a first metal material and a first portion of a second metal material interfaced with a first grain boundary of the first grain of the first metal material, wherein the first portion of the second metal material includes an upper part higher than a top surface of the conductive feature and a lower part lower than the top surface of the conductive feature.

15. The semiconductor device structure as claimed in claim 14, wherein a second portion of the second metal material continuously extends from a bottommost point of the first grain boundary extends to a topmost point of the first grain boundary.

16. The semiconductor device structure as claimed in claim 14, wherein a second portion of the second metal material is embedded in the first grain of the first metal material.

17. The semiconductor device structure as claimed in claim 14, further comprising:
   an etching stop layer; and
   a dielectric layer over the etching stop layer, wherein the electrical connection structure penetrates through the dielectric layer and the etching stop layer, a topmost point of the first grain is higher than an upper surface of the etching stop layer, and a bottommost point of the first grain is lower than a bottom surface of the etching stop layer.

18. The semiconductor device structure as claimed in claim 14, further comprising:
   a fin structure on the substrate; and
   a source/drain feature on the fin structure, wherein the conductive feature is on the source/drain feature.

19. The semiconductor device structure as claimed in claim 14, wherein the electrical connection structure includes a second grain of the first metal material and a second portion of the second metal material interfaced with a second grain boundary of the second grain boundary of the first metal material.

20. The semiconductor device structure as claimed in claim 19, wherein the first portion of the second metal material is separate from the second portion of the second metal material.

* * * * *